(12) United States Patent
Yamazaki et al.

(10) Patent No.: US 9,224,758 B2
(45) Date of Patent: Dec. 29, 2015

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Kenichi Okazaki, Tochigi (JP); Masahiro Watanabe, Tochigi (JP); Takuya Handa, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/334,079

(22) Filed: Jul. 17, 2014

(65) Prior Publication Data

US 2014/0326997 A1 Nov. 6, 2014

Related U.S. Application Data

(63) Continuation of application No. 13/905,476, filed on May 30, 2013, now Pat. No. 8,785,928.

(30) Foreign Application Priority Data

May 31, 2012 (JP) .................................. 2012-124045

(51) Int. Cl.
H01L 27/12 (2006.01)
(52) U.S. Cl.
CPC .......... *H01L 27/1225* (2013.01); *H01L 27/124* (2013.01)
(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nakayama et al., "17a-TL-8 Effect of GaO Layer on IGZO—TFT Channel", Extended Abstracts (The 57th Spring Meeting 2010), The Japan Society of Applied Physics and Related Societies, Mar. 17, 2010, pp. 21-008.

(Continued)

*Primary Examiner* — Joseph Schoenholtz
(74) *Attorney, Agent, or Firm* — Robinson Intellectual Property Law Office; Eric J. Robinson

(57) ABSTRACT

A highly reliable semiconductor device that includes a transistor including an oxide semiconductor, which can display a high-definition image and can be manufactured with a high yield. The semiconductor device includes a pixel portion including a plurality of pixels, a gate signal line driver circuit portion, and a source signal line driver circuit portion including a first circuit that controls timing of sampling video signals and a second circuit that samples the video signals in accordance with the timing and then inputs the sampled video signals to the pixels. The second circuit includes a plurality of transistors in each of which an oxide semiconductor stacked layer is used as a channel formation region, the first circuit and the second circuit are electrically connected to each other by a wiring, and the wiring is electrically connected to gates of at least two transistors of the plurality of transistors.

14 Claims, 7 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,593,387 B2 * | 11/2013 | Miyake ............ 345/99 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0079505 A1 | 4/2010 | Woo et al. |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0012105 A1 | 1/2011 | Yamazaki et al. |
| 2011/0012116 A1 * | 1/2011 | Yamazaki et al. ............ 257/59 |
| 2011/0193083 A1 | 8/2011 | Kim et al. |
| 2011/0193836 A1 | 8/2011 | Umezaki |
| 2011/0215319 A1 | 9/2011 | Yamazaki et al. |
| 2011/0215328 A1 | 9/2011 | Morosawa et al. |
| 2012/0074985 A1 | 3/2012 | Kimura |
| 2012/0119205 A1 | 5/2012 | Taniguchi et al. |
| 2012/0119270 A1 | 5/2012 | Kimura |
| 2013/0256653 A1 | 10/2013 | Ahn et al. |
| 2014/0022155 A1 * | 1/2014 | Miyake ............ 345/92 |
| 2014/0326997 A1 * | 11/2014 | Yamazaki et al. ............ 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-181801 A | 9/2011 |
| JP | 2012-160679 A | 8/2012 |
| WO | WO-2004/114391 | 12/2004 |
| WO | WO-2008/133345 | 11/2008 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission Amoled Display on Plastic Film and its Bending Properties", SID Digest '09 : SID International Symposium Digest of Technical Papers, May 31, 2009, pp. 983-985.
Sakata.J et al., "Development of 4.0-In. Amoled Display With Driver Circuit Using Amorphous In—Ga—Zn Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size Amoled", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", Journal of the SID, 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA Amoled Display Using In—Ga—Zn—Oxide TFTs With a Novel Passivation Layer", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW'06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000°C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp, 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

* cited by examiner

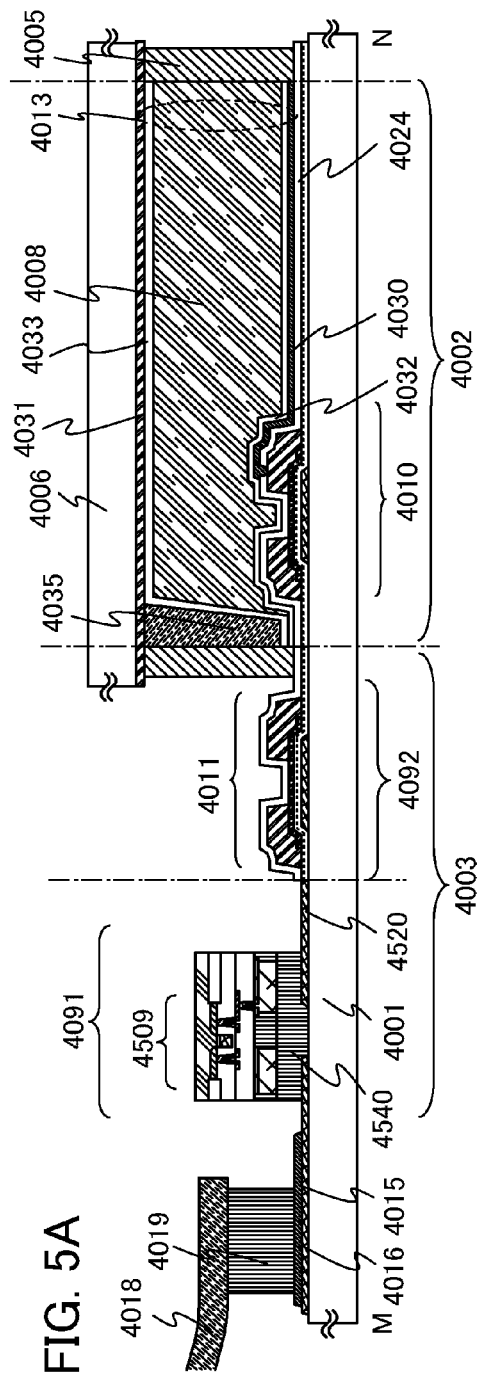
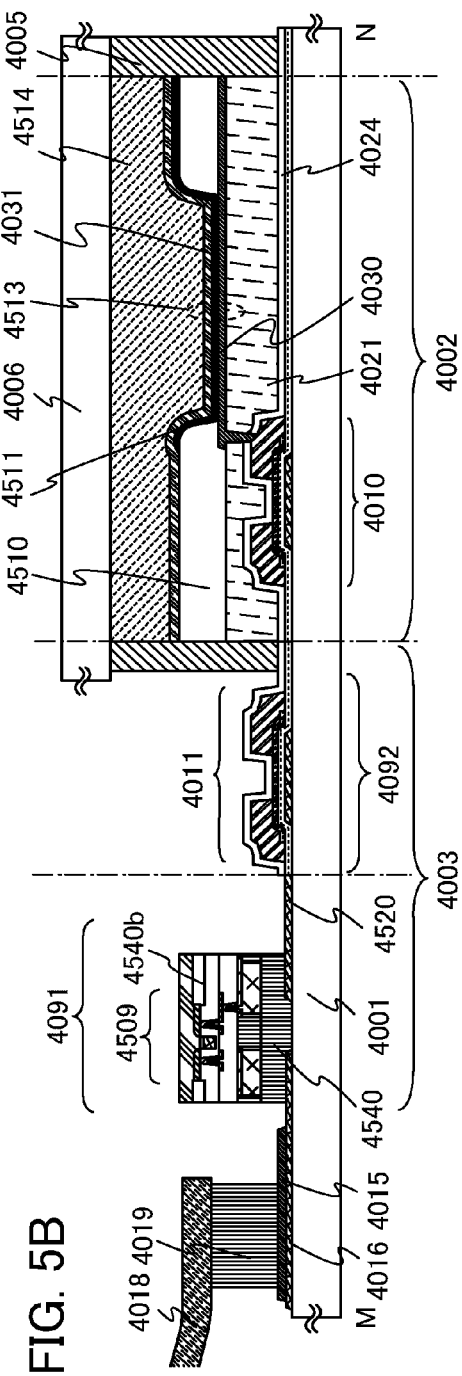
FIG. 5A
FIG. 5B

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device).

A silicon-based semiconductor material is widely known as a material for a semiconductor thin film applicable to a transistor. As another material, an oxide semiconductor has been attracting attention.

For example, a transistor whose semiconductor layer including an amorphous oxide containing indium (In), gallium (Ga), and zinc (Zn) (an In—Ga—Zn—O-based amorphous oxide) is formed over a substrate is disclosed (see Patent Document 1).

REFERENCE

[Patent Document 1] Japanese Published Patent Application No. 2011-181801

SUMMARY OF THE INVENTION

By an increase in the number of pixels and miniaturization of a pixel due to an increase in definition, the degree of integration of a wiring or the like in a semiconductor device has been increased. As such high integration progresses, a trouble such as a shape defect in a manufacturing process is likely to occur, and it is concerned that a reduction in yield or a variation and a decrease in electrical characteristics are caused.

Improvement in reliability of semiconductor devices that include transistors including an oxide semiconductor is important for commercialization of the semiconductor devices.

In particular, variation and decrease in electric characteristics of the semiconductor device might reduce the reliability thereof.

It is an object to provide a highly reliable semiconductor device which includes a transistor including an oxide semiconductor, which can display a high-definition image.

It is an object to provide a highly reliable semiconductor device which includes a transistor including an oxide semiconductor, which can be manufactured with a high yield.

One embodiment of the invention disclosed in this specification is a semiconductor device having a pixel portion including a plurality of pixels, a gate signal line driver circuit portion, and a source signal line driver circuit portion including a first circuit that controls timing of sampling video signals and a second circuit that samples the video signals in accordance with the timing and then inputs the sampled video signals to the pixels. In the semiconductor device, the second circuit includes a plurality of transistors in each of which an oxide semiconductor stacked layer is used as a channel formation region, the oxide semiconductor stacked layer includes a first oxide semiconductor film including indium and a Group 13 element other than the indium and a second oxide semiconductor film including indium and a Group 13 element other than the indium over or below the first oxide semiconductor film, the first oxide semiconductor film has an atomic ratio where an atomic percent of the indium is greater than an atomic percent of the Group 13 element other than the indium, the second oxide semiconductor film has an atomic ratio where an atomic percent of the indium is less than or equal to an atomic percent of the Group 13 element other than the indium, the first circuit and the second circuit are electrically connected to each other by a wiring, and the wiring is electrically connected to gates of at least two transistors of the plurality of transistors.

One embodiment of the invention disclosed in this specification is a semiconductor device having a pixel portion including a plurality of pixels, a gate signal line driver circuit portion, and a source signal line driver circuit portion including a first circuit that controls timing of sampling video signals and a second circuit that samples the video signals in accordance with the timing and then inputs the sampled video signals to the pixels. In the semiconductor device, the second circuit includes a plurality of transistors in each of which an oxide semiconductor stacked layer is used as a channel formation region, the oxide semiconductor stacked layer includes a first oxide semiconductor film including indium and a Group 13 element other than the indium, a second oxide semiconductor film including indium and a Group 13 element other than the indium below the first oxide semiconductor film, and a third oxide semiconductor film including indium and a Group 13 element other than the indium over the first oxide semiconductor film, the first oxide semiconductor film has an atomic ratio where an atomic percent of the indium is greater than an atomic percent of the Group 13 element other than the indium, the second oxide semiconductor film has an atomic ratio where an atomic percent of the indium is less than or equal to an atomic percent of the Group 13 element other than the indium, the third oxide semiconductor film has an atomic ratio where an atomic percent of the indium is less than or equal to an atomic percent of the Group 13 element other than the indium, the first circuit and the second circuit are electrically connected to each other by a wiring, and the wiring is electrically connected to gates of at least two transistors of the plurality of transistors.

One embodiment of the invention disclosed in this specification is a semiconductor device in which the first circuit includes a semiconductor element using a single crystal semiconductor substrate in the above structure. For example, an integrated circuit using a silicon wafer as the single crystal semiconductor substrate can be used.

One embodiment of the invention disclosed in this specification is a semiconductor device in which the plurality of transistors each has a field effect mobility of 20 $cm^2/Vs$ or higher.

One embodiment of the invention disclosed in this specification is a semiconductor device in which the first oxide semiconductor film has an atomic ratio where an atomic percent of the indium is greater than twice of an atomic percent of the Group 13 element other than the indium.

One embodiment of the invention disclosed in this specification is a semiconductor device in which the Group 13 element other than the indium is gallium.

Further, an insulating film containing nitrogen or an insulating film containing nitrogen and oxygen can be used as a gate insulating film. A silicon film containing nitrogen, an aluminum film containing nitrogen, or the like can be used as the insulating film containing nitrogen, and a silicon film containing nitrogen and oxygen, an aluminum film containing nitrogen and oxygen, or the like can be used as the insulating film containing nitrogen and oxygen.

The gate insulating film can be formed by a deposition method using a deposition gas. For example, a chemical vapor deposition (CVD) method can be used.

One embodiment of the invention disclosed in this specification is a semiconductor device in which a silicon film containing nitrogen is used as the gate insulating film.

One embodiment of the present invention relates to a semiconductor device including a transistor in which a channel formation region is formed using an oxide semiconductor or a semiconductor device including a circuit which is formed by using such a transistor. For example, the present invention relates to an electronic appliance in which an electro-optical device typified by a liquid crystal display panel or a light-emitting display device including a light-emitting element is mounted as its component.

A highly reliable semiconductor device which includes a transistor including an oxide semiconductor is provided.

BRIEF DESCRIPTION OF THE DRAWINGS

FIGS. 5A and 5B are each a cross-sectional view illustrating one embodiment of a semiconductor device.

DETAILED DESCRIPTION OF THE INVENTION

Hereinafter, embodiments of the invention disclosed in this specification are described with reference to the accompanying drawings. Note that the invention disclosed in this specification is not limited to the following description, and it is easily understood by those skilled in the art that embodiments and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device and a manufacturing method thereof is described with reference to FIGS. 1A to 1C, FIGS. 2A and 2B, FIGS. 3A to 3C, FIGS. 4A to 4C, and FIGS. 5A and 5B.

Figure 4A:
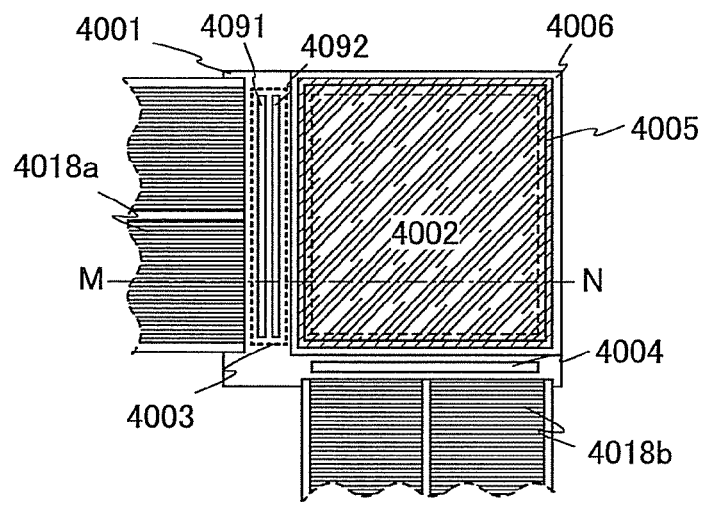
FIGS. 4A to 4C are each a plan view illustrating one embodiment of a semiconductor device.
Figure 4B:
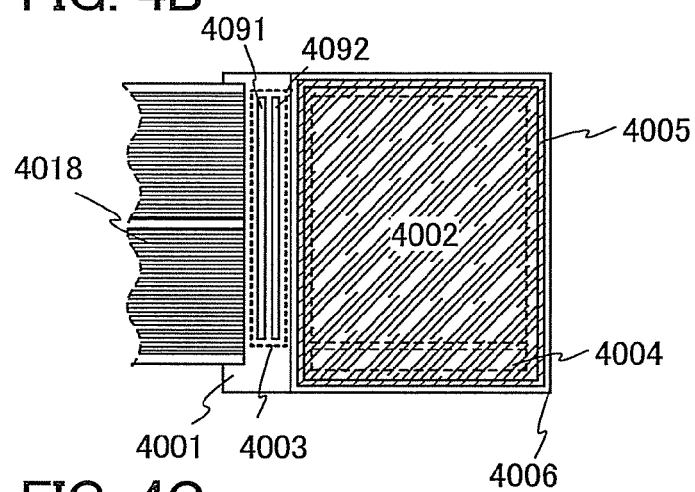
Figure 4C:
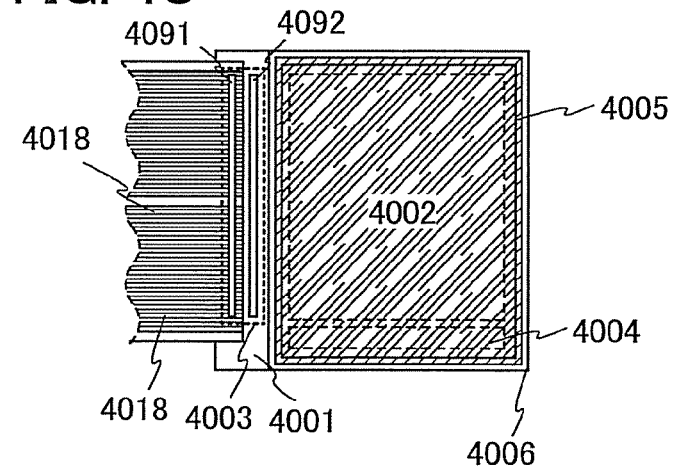

An example of a structure of a semiconductor device described in this embodiment is illustrated in FIG. 4A to 4C.

As illustrated in FIGS. 1A to 1C, FIGS. 4A to 4C, and FIGS. 5A and 5B, a semiconductor device described in this embodiment includes a pixel portion 4002 including a plurality of pixels, a gate signal line driver circuit portion 4004, and a source signal line driver circuit portion 4003 including a first circuit 4091 that controls timing of sampling video signals and a second circuit 4092 that samples the video signals in accordance with the timing and then inputs the sampled video signals to the pixels.

Figure 1A:
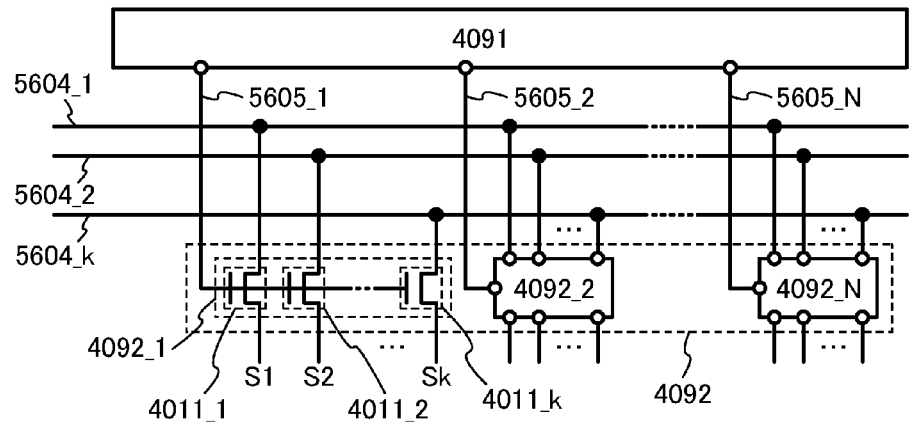
FIG. 1A is a circuit diagram illustrating one embodiment of a semiconductor device.
Figure 1B:
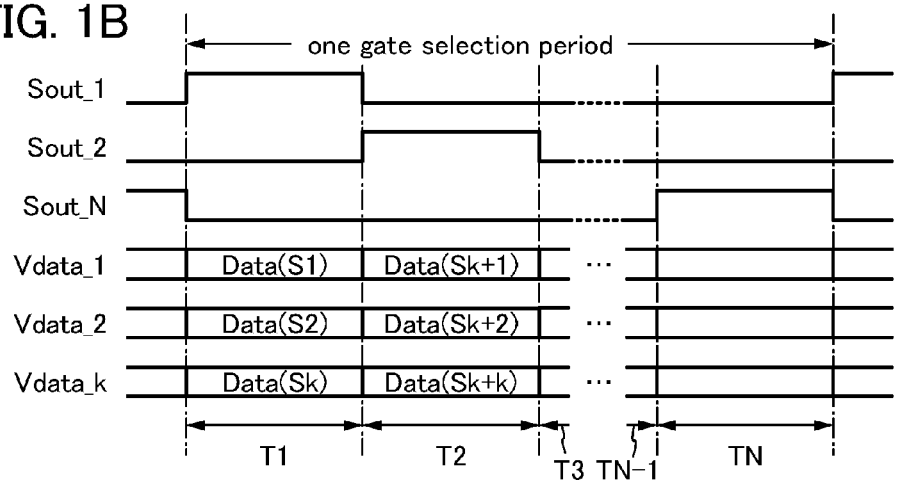
FIG. 1B is a timing chart of one embodiment of a semiconductor device.

FIGS. 1A and 1B illustrate an example of a structure and operation of the source signal line driver circuit portion 4003.

The source signal line driver circuit portion 4003 includes the first circuit 4091 that controls timing of sampling video signals and the second circuit 4092 that samples the video signals in accordance with the timing controlled by the first circuit 4091 and then inputs the sampled video signals to the pixels. The second circuit 4092 includes a plurality of second circuits 4092_1 to 4092_N (N is a natural number). The second circuits 4092_1 to 4092_N each includes a plurality of transistors 4011_1 to 4011_$k$ ($k$ is a natural number). The example where the transistors 4011_1 to 4011_$k$ are n-channel transistors is described.

As the first circuit 4091 that controls timing of sampling video signals, for example, a shift register or the like can be used.

The transistors 4011_1 to 4011_$k$ are transistors each including an oxide semiconductor stacked layer formed of a stack of a plurality of oxide semiconductor films having different compositions.

A connection relation of the source signal line driver circuit portion 4003 is described by using the second circuit 4092_1 as an example. First terminals of the transistors 4011_1 to 4011_$k$ are connected to wirings 5604_1 to 5604_$k$, respectively. Second terminals of the transistors 4011_1 to 4011_$k$ are connected to signal lines S1 to Sk, respectively. Gates of the transistors 4011_1 to 4011_$k$ are connected to a wiring 5605_1.

Figure 7:
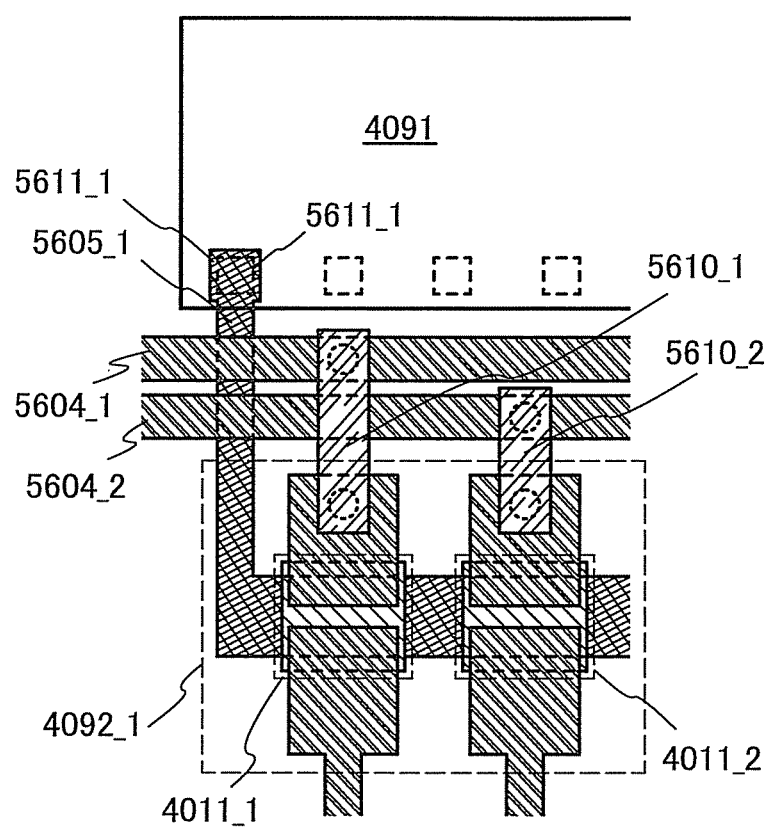
FIG. 7 is a plan view illustrating one embodiment of a semiconductor device.

FIG. 7 is a plan view of the source signal line driver circuit portion 4003. In FIG. 7, the transistors 4011_1 and 4011_2 are electrically connected to a terminal portion 5611_1 of the first circuit 4091 by the wiring 5605_1 also serving as a gate electrode layer. Further, the transistor 4011_1 is electrically connected to the wiring 5604_1 through a wiring 5610_1 and the transistor 4011_2 is electrically connected to the wiring 5604_2 through a wiring 5610_2.

As described above, the wiring 5605_1 is electrically connected to all the gates of the plurality of transistors 4011_1 to 4011_$k$, whereby the number of wirings 5605_1 to 5605_N can be reduced. By a reduction in the number of wirings, even when a semiconductor device is miniaturized and highly integrated, the distance between wirings can be kept and electrical defects due to a shape defect or the like, such as a short circuit can be prevented. Therefore, even ultra high-definition semiconductor devices with a large number of pixels, such as a 4k2k display and an 8k4k display, can be manufactured with a high yield. In addition, the reliability of the high-definition semiconductor devices with a large number of pixels can be improved.

The first circuit 4091 has a function of sequentially selecting the second circuits 4092_1 to 4092_N by sequentially outputting a High-level signal (also referred to as a High signal or a high power supply potential level) to the wirings 5605_1 to 5605_N.

The second circuit 4092_1 has a function of controlling a conduction state between the wirings 5604_1 to 5604_$k$ and the signal lines S1 to Sk (electrical continuity between the first terminals and the second terminals), that is, a function of controlling whether potentials of the wirings 5604_1 to 5604_k are supplied to the signal lines S1 to Sk. In this manner, the second circuit 4092_1 functions as a selector. Moreover, the transistors 4011_1 to 4011_k have functions of controlling conduction states between the wirings 5604_1 to 5604_k and the signal lines S1 to Sk, respectively, that is, functions of supplying potentials of the wirings 5604_1 to 5604_k to the signal lines S1 to Sk, respectively. In this manner, each of the transistors 4011_1 to 4011_k functions as a switch.

Note that video signal data (DATA) is inputted to each of the wirings 5604_1 to 5604_k. The video signal data (DATA) is an analog signal corresponding to image data or image signals in many cases.

Next, operation of the first circuit 4091 in FIG. 1A is described with reference to a timing chart in FIG. 1B. Examples of signals Sout_1 to Sout_N and signals Vdata_1 to Vdata_k are shown in FIG. 1B. The signals Sout_1 to Sout_N are examples of output signals from the first circuit 4091. The signals Vdata_1 to Vdata_k are examples of signals input to the wirings 5604_1 to 5604_k. Note that one operation period of the first circuit 4091 corresponds to one gate selection period of the display device. For example, one gate selection period is divided into periods T1 to TN. The periods T1 to TN are periods for writing video signal data (DATA) to the pixels which belong to a selected row.

In the periods T1 to TN, the first circuit 4091 sequentially outputs High-level signals to the wirings 5605_1 to 5605_N. For example, in the period T1, the first circuit 4091 outputs a High-level signal to the wiring 5605_1. Then, the transistors 4011_1 to 4011_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in the first to k-th columns in the selected row through the transistors 4011_1 to 4011_k. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. By writing video signals to pixels of every plurality of columns, writing time can be extended and insufficient writing of video signals can be prevented.

Figure 1C:
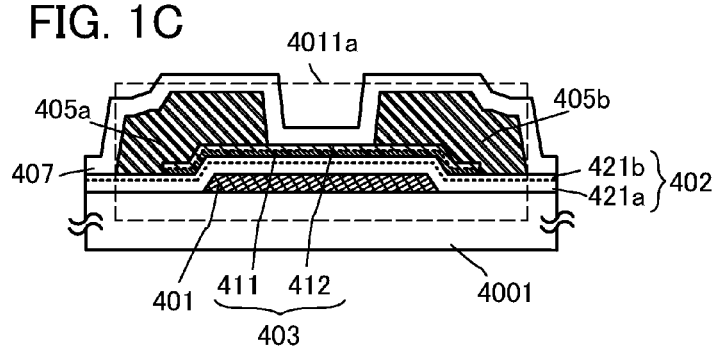
FIG. 1C is a cross-sectional view illustrating one embodiment of a semiconductor device.

FIG. 1C illustrates an example of a transistor that can be used for the transistors 4011_1 to 4011_k in the second circuit 4092.

A transistor 4011a illustrated in FIG. 1C is an example of a transistor which is a kind of bottom-gate transistor and is also referred to as an inverted-staggered transistor. FIG. 1C is a cross-sectional view of the transistor in the channel length direction.

The transistor 4011a provided over a substrate 4001 includes a gate electrode layer 401, a gate insulating film 402 including a stack of a nitride insulating film 421a and a nitride insulating film 421b over the gate electrode layer 401, an oxide semiconductor stacked layer 403 including a stack of a first oxide semiconductor film 411 and a second oxide semiconductor film 412, a source electrode layer 405a, and a drain electrode layer 405b. An insulating film 407 is provided to cover the transistor 4011_a.

The first oxide semiconductor film 411 and the second oxide semiconductor film 412 are oxide semiconductor films having different compositions. The first oxide semiconductor film 411 and the second oxide semiconductor film 412 are the same kind of films; however, the films have different atomic ratios of elements included therein.

The transistor 4011a is an example of a transistor in which a silicon film containing nitrogen is used as the nitride insulating film 421a and the nitride insulating film 421b. The silicon film containing nitrogen has a higher relative permittivity than a silicon oxide film and needs a larger thickness for an equivalent capacitance. Thus, the physical thickness of the gate insulating film can be increased. This makes it possible to reduce a decrease in withstand voltage of the transistor 4011a and furthermore increase the withstand voltage, thereby reducing electrostatic discharge damage to a semiconductor device.

As the silicon film containing nitrogen, for example, a silicon nitride film, a silicon nitride oxide film, or a silicon oxynitride film can be used; in particular, a silicon nitride film is preferably used because a film containing a larger amount of nitrogen has a higher relative permittivity. Silicon oxide has an energy gap of 8 eV, whereas silicon nitride has a small energy gap of 5.5 eV and accordingly has a low resistivity. Thus, the use of a silicon nitride film can increase resistance to ESD. In addition, in the case where a silicon nitride film is formed by a CVD method, it is not necessary to use an $N_2O$ gas that is a greenhouse gas and is used when a silicon film containing oxygen and nitrogen such as a silicon nitride oxide film is formed by a CVD method. Note that in this specification, a "silicon oxynitride film" refers to a film that includes more oxygen than nitrogen, and a "silicon nitride oxide film" refers to a film that includes more nitrogen than oxygen.

In this embodiment, a silicon nitride film is used as the nitride insulating film 421a and the nitride insulating film 421b.

As the nitride insulating film 421a, a silicon nitride film which has a larger thickness than the nitride insulating film 421b and in which the number of defects is reduced is used. For example, the nitride insulating film 421a has a thickness greater than or equal to 300 nm and less than or equal to 400 nm. Further, in the silicon nitride film to be used as the nitride insulating film 421a, the spin density of a signal which appears in the Nc center (the g value is 2.003) of signals measured by electron spin resonance (ESR) is preferably less than or equal to $1\times10^{17}$ spins/cm$^3$ and further preferably less than or equal to $5\times10^{16}$ spins/cm$^3$. As described above, by providing a silicon nitride film having a large thickness (e.g., 300 nm or more) in which the number of defects is reduced, it is possible that the nitride insulating film 421a has an ESD resistance of 300 V or more.

Since the nitride insulating film 421b is in contact with the oxide semiconductor stacked layer 403, the nitride insulating film 421b should include a silicon nitride film having a low concentration of hydrogen contained therein. The hydrogen concentration of the nitride insulating film 421b should be lower than at least that of the nitride insulating film 421a. For example, in the case where the nitride insulating film 421a and the nitride insulating film 421b are formed by a plasma CVD method, the hydrogen concentration of the nitride insulating film 421b can be made lower than that of the nitride insulating film 421a by decreasing the concentration of hydrogen contained in a supply gas. Specifically, in the case where silicon nitride films are formed as the nitride insulating film 421a and the nitride insulating film 421b, the nitride insulating film 421b may be formed at a lower ammonia flow rate than in a supply gas for forming the nitride insulating film 421a, or may be formed without using ammonia.

The thickness of the nitride insulating film 421b is greater than or equal to 25 nm and less than or equal to 150 nm. Since the silicon nitride film having a low concentration of hydrogen contained therein is provided as the nitride insulating film 421b, it is possible to reduce the entry of hydrogen or a hydrogen compound (e.g., water) into the oxide semiconductor stacked layer 403. When hydrogen and an oxide semiconductor are bonded to each other, part of the hydrogen serves as a donor and causes generation of electrons that are carriers, which is a cause of shift of the threshold voltage of the transistor in the negative direction. Therefore, a silicon nitride film having a low hydrogen concentration is provided as the nitride insulating film 421b, whereby the electrical characteristics of the transistor can be stabilized. In addition, when a silicon nitride film having a low hydrogen concentration is provided as the nitride insulating film 421b, the nitride insulating film 421b also serves as a barrier film to prevent impurities such as hydrogen or a hydrogen compound contained in the nitride insulating film 421a from diffusing into the oxide semiconductor stacked layer 403.

Note that both the nitride insulating film 421a and the nitride insulating film 421b in this embodiment are silicon nitride films, and the interface between these nitride insulating films may become vague depending on materials or film formation conditions. Thus, in FIG. 1C, the interface between the nitride insulating film 421a and the nitride insulating film 421b is illustrated schematically with a dotted line. The same applies to other drawings described below.

The oxide semiconductor stacked layer 403 has a layered structure including two or more layers. In the case of two layers, the oxide semiconductor stacked layer 403 includes the first oxide semiconductor film 411 including indium and a Group 13 element other than indium and the second oxide semiconductor film 412 including indium and a Group 13 element other than indium over or below the first oxide semiconductor film 411. The first oxide semiconductor film 411 has an atomic ratio where an atomic percent of indium is greater than an atomic percent of the Group 13 element other than indium and the second oxide semiconductor film 412 has an atomic ratio where an atomic percent of indium is less than or equal to an atomic percent of the Group 13 element other than indium.

In the plurality of oxide semiconductor films forming the oxide semiconductor stacked layer 403 in this embodiment, the interface between these oxide semiconductor films may become vague depending on materials or film formation conditions. Thus, in FIG. 1C, the interface between the plurality of oxide semiconductor films forming the oxide semiconductor stacked layer 403 is illustrated schematically with a dotted line. The same applies to other drawings described below.

The first oxide semiconductor film 411 preferably has an atomic ratio where an atomic percent of indium is greater than twice of an atomic percent of the Group 13 element other than indium.

The transistor 4011a is an example of a transistor in which the first oxide semiconductor film 411 having an atomic ratio where an atomic percent of indium is greater than an atomic percent of a Group 13 element other than indium and the second oxide semiconductor film 412 has an atomic ratio where an atomic percent of indium is less than or equal to an atomic percent of a Group 13 element other than indium are sequentially stacked from the gate insulating film 402 side.

Figure 2A:
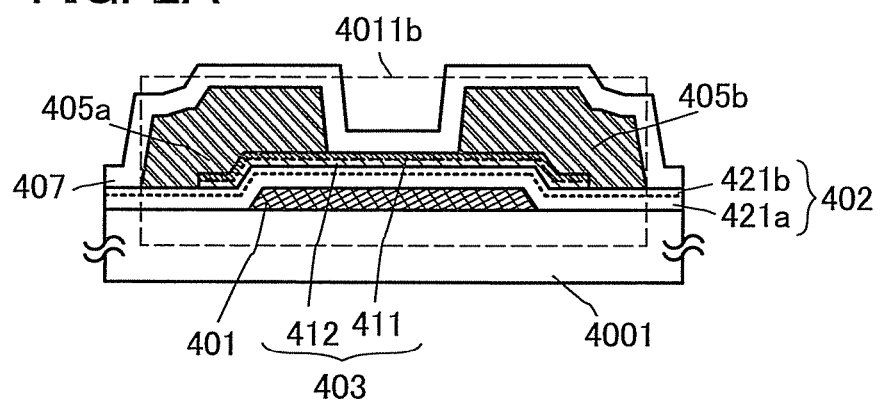
FIGS. 2A and 2B are each a cross-sectional view illustrating one embodiment of a semiconductor device.

A transistor 4011_b illustrated in FIG. 2A is an example of a transistor in which the second oxide semiconductor film 412 has an atomic ratio where an atomic percent of indium is less than or equal to an atomic percent of a Group 13 element other than indium and the first oxide semiconductor film 411 having an atomic ratio where an atomic percent of indium is greater than an atomic percent of a Group 13 element other than indium are sequentially stacked from the gate insulating film 402 side.

In the case of the transistors 4011a and 4011_b, for example, an oxide semiconductor film containing indium, gallium, and zinc is used as each of the first oxide semiconductor film 411 and the second oxide semiconductor film 412. Here, the atomic ratio of the first oxide semiconductor film 411 can be In:Ga:Zn=3:1:2 and the atomic ratio of the second oxide semiconductor film 412 can be In:Ga:Zn=1:1:1.

Further, oxide semiconductors having different crystallinities may be used for the first oxide semiconductor film 411 and the second oxide semiconductor film 412. That is, the first oxide semiconductor film 411 and the second oxide semiconductor film 412 may be formed using a combination of any of a single crystal oxide semiconductor, a polycrystalline oxide semiconductor, an amorphous oxide semiconductor, and a c-axis aligned crystalline oxide semiconductor (CAAC-OS), as appropriate. When an amorphous oxide semiconductor is used for at least one of the first oxide semiconductor film 411 and the second oxide semiconductor film 412, for example, internal stress or external stress of the oxide semiconductor stacked layer 403 is relieved, variation in characteristics of a transistor 4011 is reduced, and reliability of the transistor 4011 can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor film on the channel side is preferably formed using a crystalline oxide semiconductor such as a CAAC-OS.

Figure 2B:
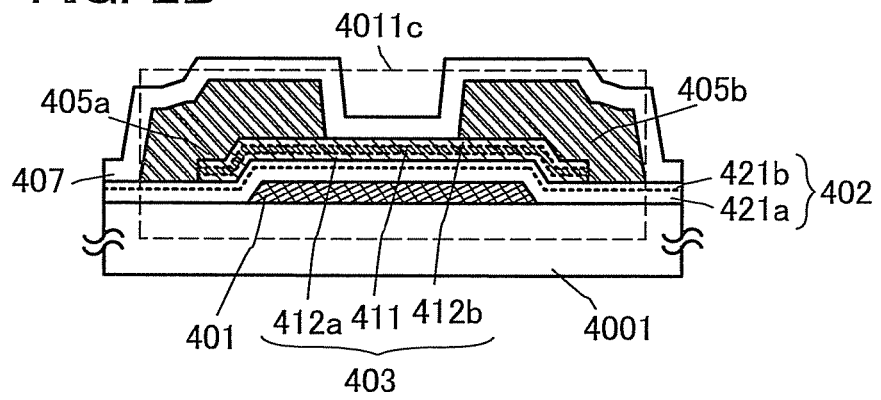

Further, in the case where the oxide semiconductor stacked layer 403 has a layered structure including three layers like a transistor 4011c illustrated in FIG. 2B, the oxide semiconductor stacked layer 403 includes the first oxide semiconductor film 411 including indium and a Group 13 element other than indium, a second oxide semiconductor film 412a including indium and a Group 13 element other than indium below the first oxide semiconductor film 411, and a third oxide semiconductor film 412b including indium and a Group 13 element other than indium over the first oxide semiconductor film 411. The first oxide semiconductor film 411 has the atomic ratio where the atomic percent of indium is greater than the atomic percent of the Group 13 element other than indium. The second oxide semiconductor film 412a has the atomic ratio where the atomic percent of indium is less than or equal to the atomic percent of the Group 13 element other than indium. The third oxide semiconductor film 412b has the atomic ratio where the atomic percent of indium is less than or equal to the atomic percent of the Group 13 element other than indium.

In the case of the transistor 4011c, for example, an oxide semiconductor film containing indium, gallium, and zinc is used as each of the first oxide semiconductor film 411 and the second oxide semiconductor film 412a, and the third oxide semiconductor film 412b. Here, the atomic ratio of the first oxide semiconductor film 411 can be In:Ga:Zn=3:1:2, the atomic ratio of the second oxide semiconductor film 412a can be In:Ga:Zn=1:3:2, and the atomic ratio of the third oxide semiconductor film 412b can be In:Ga:Zn=1:1:1.

Further, in the case where the oxide semiconductor stacked layer 403 has a layered structure including three or more layers like the transistor 4011c, an amorphous oxide semiconductor film may be interposed between a plurality of oxide semiconductor films having crystallinity. Furthermore, a structure in which an oxide semiconductor film having crystallinity and an amorphous oxide semiconductor film are alternately stacked may be employed.

Figure 3A:
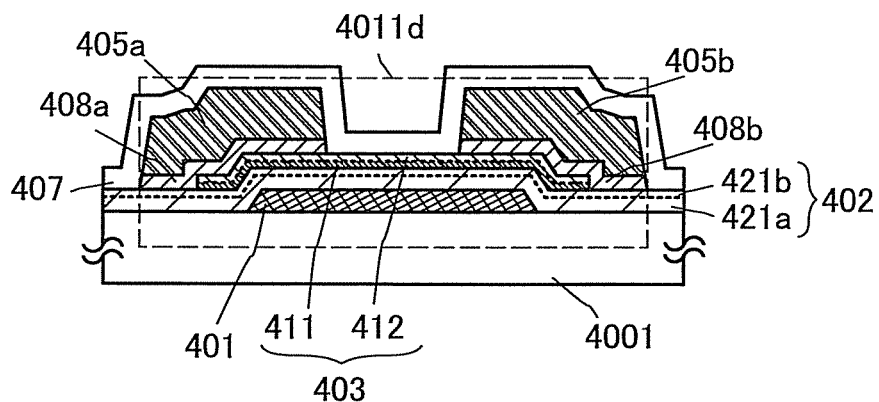
FIGS. 3A to 3C are each a cross-sectional view illustrating one embodiment of a semiconductor device.

Further, as illustrated in a transistor 4011d in FIG. 3A, a conductive film 408a may be provided between the source electrode layer 405a and the oxide semiconductor stacked layer 403 and a conductive film 408b may be provided between the drain electrode layer 405b and the oxide semiconductor stacked layer 403. It is preferable that a film having a function of blocking metal elements included in the source electrode layer 405a and the drain electrode layer 405b be used as the conductive films 408a and 408b so that an adverse effect is not caused by diffusion of the metal element into the oxide semiconductor stacked layer or the like. For example, copper having low resistance that is suitable for a wiring can be used as the source electrode layer 405a and the drain electrode layer 405b, and a tungsten film, a molybdenum film, a titanium film, or the like which blocks diffusion of copper into the oxide semiconductor stacked layer 403 can be provided as the conductive films 408a and 408b.

Figure 3B:
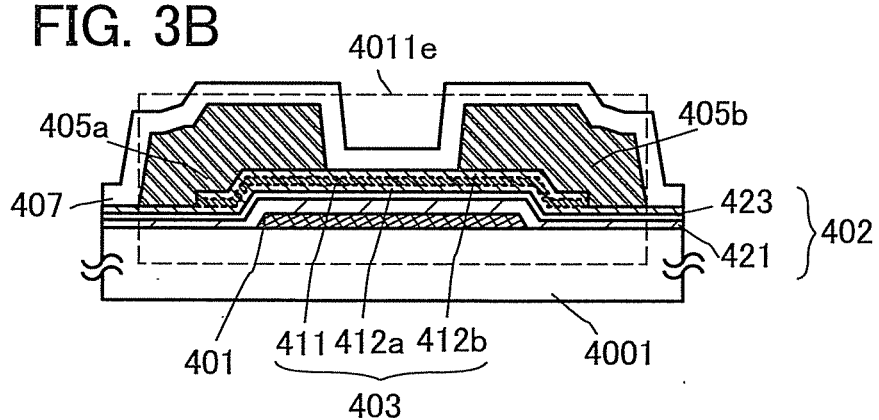

Further, as illustrated in a transistor 4011e in FIG. 3B, the second oxide semiconductor film 412a (e.g., an atomic ratio of In:Ga:Zn=1:3:2) may provided on the gate insulating film 402 side by being extended over the gate insulating film 402 without being processed into an island shape. The transistor 4011e is an example of a transistor including a stack of the nitride insulating film 421 (e.g., a silicon nitride film) and an oxide insulating film 423 (e.g., a silicon oxide film or a silicon oxide film containing nitrogen) as the gate insulating film 402.

Figure 3C:
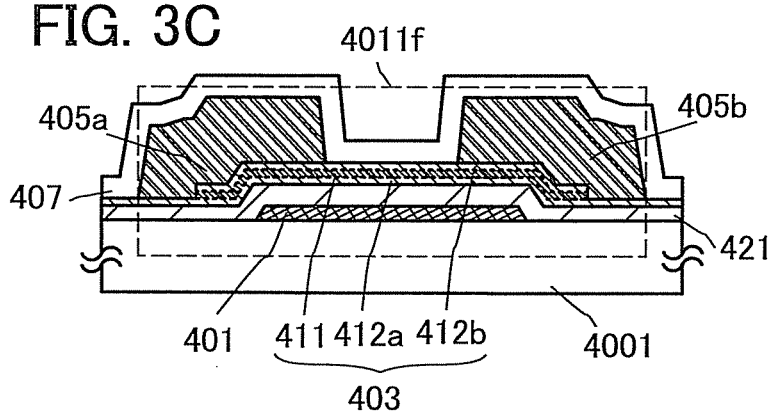

Furthermore, as illustrated in a transistor 4011f in FIG. 3C, the nitride insulating film 421 (e.g., a silicon nitride film) may be provided as the gate insulating film 402, and the second oxide semiconductor film 412a (e.g., an atomic ratio of In:Ga:Zn=1:3:2) may be provided by being extended over the gate insulating film 421 without being processed into an island shape.

A table 1 shows examples of films that can be used for the first oxide semiconductor film 411, the second oxide semiconductor film 412 (412a), and the third oxide semiconductor film 412b. Table 1 shows examples in which oxide semiconductor films including indium, gallium, and zinc are used for the first oxide semiconductor film 411, the second oxide semiconductor film 412 (412a), and the third oxide semiconductor film 412b.

TABLE 1

| Second oxide semiconductor film 412(412a) Third oxide semiconductor film 412b | | First oxide semiconductor film 411 |
|---|---|---|
| In < Ga | In = Ga In ≈ Ga | In > Ga |
| | In:Ga:Zn (atomic ratio) | |
| 1:3:2 | 1:1:1 | 3:1:2 |
| 2:4:3 | 2:2:2 | 4:2:3 |
| 1:5:3 | 3:3:3 | 5:1:3 |
| | 4:4:4 | 5:3:4 |
| | | 6:2:4 |
| | | 7:1:3 |

Note that the atomic ratio of a target reflects the atomic ratio of an oxide semiconductor film to be formed. Therefore, by formation of an oxide semiconductor film using a target having a desired atomic ratio by a sputtering method, the oxide semiconductor film that reflects the desired atomic ratio can be obtained.

The transistors 4011a to 4011f can be transistors each having a field effect mobility of 20 $cm^2$/Vs or higher.

An oxide semiconductor used for the oxide semiconductor stacked layer 403 includes at least indium (In) and a Group 13 element other than indium. As the Group 13 element other than indium, gallium can be used. Instead of the Group 13 element other than indium, zirconium (Zr), hafnium (Hf), germanium (Ge), Tin (Sn), iron (Fe), manganese (Mn), or cobalt (Co) may be used.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

In addition, as a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

For example, it is possible to use an In—Ga—Zn-based oxide with an atomic ratio of In:Ga:Zn=1:1:1, In:Ga:Zn=2:2:1, In:Ga:Zn=3:1:2, or In:Ga:Zn=1:3:2, or any of oxides whose composition is in the neighborhood of the above compositions. Alternatively, an In—Sn—Zn-based oxide with an atomic ratio of In:Sn:Zn=1:1:1, In:Sn:Zn=2:1:3, or In:Sn:Zn=2:1:5, or any of oxides whose composition is in the neighborhood of the above compositions may be used.

However, without limitation to the materials given above, a material with an appropriate composition may be used as the oxide semiconductor containing indium depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \geq r^2$, and r may be 0.05, for example. The same applies to other oxides.

The oxide semiconductor stacked layer 403 may be in a non-single-crystal state, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. Note that in most cases, a crystal part in the CAAC-OS fits inside a cube whose one side is 100 nm in an image obtained with the TEM, for example. In an image obtained with a TEM, a boundary between the crystal parts in the CAAC-OS is not clearly observed in some cases. In an image obtained with a TEM, a grain boundary in the CAAC-OS is not clearly observed in some cases. In the CAAC-OS which does not have a clear boundary, for example, segregation of an impurity, an increase in the density of defect states, and a reduction in electron mobility hardly occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak may be observed at a diffraction angle (2θ) of around 31°. In the case of an InGaZnO$_4$ crystal, the peak at 2θ of around 31° is derived from the (009) plane of the InGaZnO$_4$ crystal. Further, in the CAAC-OS, for example, a peak may be observed at 2θ of around 36°. In the case of a ZnGa$_2$O$_4$ crystal, the peak at 2θ of around 36° is derived from the (222) plane of the ZnGa$_2$O$_4$ crystal. It is preferable that a peak be observed at 2θ of around 31° and a peak be not observed at 2θ of around 36° in the CAAC-OS.

In the CAAC-OS, for example, among crystal parts, the directions of the a-axis and the b-axis of one crystal part are different from those of another crystal part, in some cases. For example, in the case of the CAAC-OS having an InGaZnO$_4$ crystal, when the CAAC-OS is analyzed by an in-plane method in which an X-ray enters a sample in a direction perpendicular to the c-axis with an XRD apparatus, a peak may be observed at 2θ of around 56°. The peak at 2θ of around 56° is derived from the (110) plane of the InGaZnO$_4$ crystal. Here, analysis (φ scan) is performed under conditions where the sample is rotated around a normal vector of a sample surface, which is used as an axis (φ axis), with 2θ fixed around 56°. In the case where the sample is a single-crystal oxide semiconductor in which the a-axis and the b-axis are oriented in the same direction, six peaks are observed; in contrast, in the case of the CAAC-OS, a peak is not clearly observed.

As described above, in the CAAC-OS, for example, c-axes are aligned, and a-axes and/or b-axes are not macroscopically aligned, in some cases.

Further, for example, spots (luminescent spots) are shown in an electron diffraction image of the CAAC-OS in some cases. An electron diffraction image obtained with an electron beam having a beam diameter of 10 nmφ or smaller, or 5 nmφ or smaller, is called a nanobeam electron diffraction image.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies form trap states or serve as carrier generation sources when hydrogen is captured therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor including the oxide semiconductor having a high density of trap states in the channel formation region has unstable electrical characteristics in some cases.

With the use of the high purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with the TEM, for example, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with the TEM, a boundary between crystal parts is not clearly observed in some cases. In the nc-OS which does not have a clear boundary, for example, segregation of an impurity, an increase in the density of defect states, and a reduction in electron mobility hardly occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, for example, depending on an analysis method. When the nc-OS film is analyzed by an out-of-plane method with an XRD apparatus using an X-ray having a beam diameter larger than that of a crystal part, a peak which shows alignment does not appear in some cases. Further, for example, a halo pattern is shown in some cases in an electron diffraction image of the nc-OS obtained by using an electron beam having a beam diameter larger than that of a crystal part (for example, a beam diameter of 20 nm$\phi$ or more, or 50 nm$\phi$ or more). For example, spots are shown in some cases in a nanobeam electron diffraction image of the nc-OS obtained by using an electron beam having a beam diameter smaller than or equal to that of a crystal part (for example, a beam diameter of 10 nm$\phi$ or less, or 5 nm$\phi$ or less). In a nanobeam electron diffraction image of the nc-OS, for example, regions with high luminance in a circular pattern are shown in some cases. In a nanobeam electron diffraction image of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while keeping its crystal state, whereby the crystal state of the sputtering target is transferred to the substrate and the CAAC-OS film can be formed.

For the deposition of the CAAC-OS film, the following conditions are preferably used.

By reducing the concentration of impurities in the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a designated surface" and is defined by Formula (I).

$$Ra = \frac{1}{S_0} \int_{y_1}^{y_2} \int_{x_1}^{x_2} |f(x, y) - Z_0| \, dx \, dy \qquad \text{[FORMULA 1]}$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the designated surface on the xy plane, and $Z_0$ represents the height of the reference surface (the average height of the designated surface). Ra can be measured using an atomic force microscope (AFM).

Note that since the transistor 4011 is a bottom-gate transistor, the substrate 4001, the gate electrode layer 401, and the gate insulating film 402 are located below the oxide semiconductor film. Accordingly, planarization treatment such as CMP treatment may be performed after the formation of the gate electrode layer 401 and the gate insulating film 402 to obtain the above flat surface.

The oxide semiconductor stacked layer 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate.

It is preferable that the oxide semiconductor stacked layer 403 be the one which is highly purified and hardly contains impurities such as copper and chlorine. In the process for manufacturing the transistor, steps in which these impurities are not mixed or attached to the surface of the oxide semiconductor film are preferably selected as appropriate. In the case where the impurities are attached to the surface of the oxide semiconductor film, the impurities on the surface of the oxide semiconductor film are preferably removed by exposure to oxalic acid or dilute hydrofluoric acid or plasma treatment (such as $N_2O$ plasma treatment). Specifically, the concentration of copper in the oxide semiconductor film is lower than or equal to $1 \times 10^{18}$ atoms/cm$^3$, preferably lower than or equal to $1 \times 10^{17}$ atoms/cm$^3$. Further, the concentration of aluminum in the oxide semiconductor film is lower than or equal to $1 \times 10^{18}$ atoms/cm$^3$. Further, the concentration of chlorine in the oxide semiconductor film is lower than or equal to $2 \times 10^{18}$ atoms/cm$^3$.

There is no particular limitation on a substrate that can be used as the substrate 4001 having an insulating surface as long as it has at least heat resistance to withstand heat treatment in a later step. A variety of glass substrates for electronics industry, such as a barium borosilicate glass substrate and an aluminoborosilicate glass substrate, can be used as the substrate 4001. Note that as the substrate, a substrate having a thermal expansion coefficient of greater than or equal to $25 \times 10^{-7}$/° C. and less than or equal to $50 \times 10^{-7}$/° C. (preferably greater than or equal to $30 \times 10^{-7}$/° C. and less than or equal to $40 \times 10^{-7}$/° C.) and a strain point of higher than or equal to 650° C. and lower than or equal to 750° C. (preferably higher than or equal to 700° C. and lower than or equal to 740° C.) is preferably used.

In the case where a large-sized substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, when such a large-sized glass substrate is used as the substrate, the one with a small shrinkage is preferably used. For example, the substrate can be a large-sized glass substrate in which, after heat treatment which is performed for one hour at preferably 450° C., more preferably 500° C., the amount of shrinkage is less than or equal to 20 ppm, preferably less than or equal to 10 ppm, further preferably less than or equal to 5 ppm.

Alternatively, as the substrate 4001, a ceramic substrate, a quartz substrate, a sapphire substrate, or the like can be used. Alternatively, a single crystal semiconductor substrate or a polycrystalline semiconductor substrate made of silicon or silicon carbide, a compound semiconductor substrate made of silicon germanium or the like, an SOI substrate, or the like can be used. Alternatively, any of these substrates over which a semiconductor element is provided may be used.

The semiconductor device may be manufactured using a flexible substrate as the substrate 4001. To manufacture a flexible semiconductor device, the transistor 4011 including the oxide semiconductor stacked layer 403 may be directly formed over a flexible substrate; or the transistor 4011 including the oxide semiconductor stacked layer 403 may be formed over a substrate, and then separated and transferred to a flexible substrate. Note that in order to separate the transistor from the manufacturing substrate and transfer it to the flexible substrate, a separation layer may be provided between the manufacturing substrate and the transistor 4011 including the oxide semiconductor film.

As a base film, an insulating film may be provided over the substrate 4001. The insulating film can be formed by a plasma CVD method, a sputtering method, or the like using an oxide insulating film of silicon oxide, silicon oxynitride, aluminum oxide, aluminum oxynitride, hafnium oxide, or gallium oxide; a nitride insulating film of silicon nitride, silicon nitride oxide, aluminum nitride, or aluminum nitride oxide; or a film of a mixed material of any of the above materials.

Further, as the insulating film, a film of the same kind as the nitride insulating film 421b having a barrier property against impurities may be used. The film is formed using the same material and the same process as those of the nitride insulating film 421b. For example, the transistor 4011a may have a layered structure including three layers of the nitride insulating film 421b, the nitride insulating film 421a, and the nitride insulating film 421b over the substrate 4001. A film like the nitride insulating film 421b having a barrier property against impurities is provided between the substrate 4001 and the nitride insulating film 421a, whereby entry of an impurity from the substrate 4001 into the nitride insulating film 421a can be blocked.

The substrate 4001 (or the substrate 4001 and the base film) may be subjected to heat treatment. For example, the heat treatment may be performed with a gas rapid thermal annealing (GRTA) apparatus, in which heat treatment is performed using a high temperature gas, at 650° C. for 1 minute to 5 minutes. As the high temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to 1 hour.

As the source electrode layer 405a, the drain electrode layer 405b, and the gate electrode layer 401, a metal film containing one or more elements selected from aluminum, chromium, copper, tantalum, titanium, molybdenum, tungsten, neodymium, and scandium, a metal nitride film containing any of these elements as its component (a titanium nitride film, a molybdenum nitride film, or a tungsten nitride film), or the like can be used. Alternatively, a semiconductor film typified by a polycrystalline silicon film doped with an impurity element such as phosphorus, or a silicide film such as a nickel silicide film may be used as the source electrode layer 405a, the drain electrode layer 405b, and the gate electrode layer 401.

The source electrode layer 405a, the drain electrode layer 405b, and the gate electrode layer 401 may each be a conductive metal oxide film. As the conductive metal oxide film, a metal oxide film containing one or more elements selected from indium oxide, tin oxide, zinc oxide, indium oxide-tin oxide, indium oxide-zinc oxide or a metal oxide film including any of these metal oxide materials in which silicon oxide is contained can be used.

The source electrode layer 405a, the drain electrode layer 405b, and the gate electrode layer 401 may have either a single-layer structure or a stacked-layer structure of the above conductive films. For example, a metal film having a high melting point, such as titanium, molybdenum or tungsten, or a metal nitride film of any of these metals (e.g., a titanium nitride film, a molybdenum nitride film, or a tungsten nitride film) may be stacked on one or both of the lower side or the upper side of a metal film of aluminum, copper, or the like.

For example, as the gate electrode layer 401, a structure in which copper is formed over a tungsten nitride film or a titanium nitride film and a tungsten film, a molybdenum film, or a titanium film is stacked over the copper can be used.

The source electrode layer 405a, the drain electrode layer 405b, and the gate electrode layer 401 can be formed by a sputtering method, a CVD method (e.g., a plasma CVD method), a deposition method, or the like.

The insulating film 407 and the gate insulating film 402 can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film.

Alternatively, the insulating film 407 and the gate insulating film 402 can be formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide. Further, the insulating film 407 and the gate insulating film 402 may have either a single-layer structure or a stacked-layer structure.

Alternatively, as the insulating film 407, an oxide film containing indium, gallium, and zinc (e.g., an atomic ration of In:Ga:Zn=1:3:2) may be used.

The insulating film 407 and the gate insulating film 402 can be formed by a sputtering method, a molecular beam epitaxy (MBE) method, a chemical vapor deposition (CVD) method (e.g., a plasma CVD method), a pulsed laser deposition method, an atomic layer deposition (ALD) method, or the like as appropriate. Alternatively, a metal organic chemical vapor deposition (MOCVD) method may be employed. For example, a gallium oxide film deposited by an MOCVD method can be used as the insulating film 407 and the gate insulating film 402.

It is preferable that the insulating film 407 and the gate insulating film 402 contain a large amount of oxygen in a portion in contact with the oxide semiconductor stacked layer 403. It is preferable that the oxygen content of each of the insulating film 407 and the gate insulating film 402 in (a bulk of) the film be in excess of that in the stoichiometric composition. With the use of a film containing a large amount of oxygen as the insulating film 407 and the gate insulating film 402, oxygen can be supplied to the oxide semiconductor stacked layer 403, and favorable characteristics can be obtained. It is preferable that the insulating film 407 and the gate insulating film 402 be formed in consideration of the size of a transistor to be manufactured and the step coverage with the insulating film 407 and the gate insulating film 402.

The insulating film 407 is preferably a dense film which can prevent release of oxygen from the oxide semiconductor stacked layer 403 and entry of impurities such as hydrogen and moisture. The insulating film 407 may be a stack of an oxygen-excess film and the dense film.

Further, heat treatment may be performed on the oxide semiconductor stacked layer 403 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is a kind of heat treatment apparatus, and the oxide semiconductor stacked layer 403 is subjected to the heat treatment at 450° C. for an hour in a nitrogen atmosphere.

Further, a heat treatment apparatus used is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

After the semiconductor stacked layer 403 is heated by the heat treatment, a high-purity oxygen gas, a high-purity dinitrogen monoxide gas, or ultra-dry air (air with a moisture amount of less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is set to preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component material of the oxide semiconductor and that is reduced by the step for removing an impurity for dehydration or dehydrogenation, so that the oxide semiconductor stacked layer 403 can be high purified.

Note that the heat treatment for dehydration or dehydrogenation may be performed at the time when the oxide semiconductor stacked layer 403 is in film form or after being processed by etching. The heat treatment for dehydration or dehydrogenation may be performed plural times and may be combined with another heat treatment.

Further, oxygen (which includes at least one of an oxygen radical, an oxygen atom, and an oxygen ion) may be added to the oxide semiconductor stacked layer 403 after being subjected to the dehydration or dehydrogenation treatment to supply oxygen to the oxide semiconductor stacked layer.

Oxygen which is added to the dehydrated or dehydrogenated oxide semiconductor stacked layer 403 to supply oxygen to the film can highly purify the oxide semiconductor stacked layer 403 and make the film an electrically i-type (intrinsic). Variation in the electric characteristics of a transistor including the highly purified and i-type (intrinsic) oxide semiconductor stacked layer 403 is suppressed and the transistor is electrically stable.

Oxygen can be introduced by an ion implantation method, an ion doping method, a plasma immersion ion implantation method, plasma treatment, or the like.

The introduction of oxygen to the oxide semiconductor stacked layer 403 is preferably performed after dehydration or dehydrogenation treatment is performed thereon, but the timing is not limited thereto. Further, oxygen may be introduced plural times into the oxide semiconductor stacked layer 403 which has been subjected to the dehydration or dehydrogenation treatment.

As described above, a semiconductor device in this embodiment can be a high-performance and high-reliability semiconductor device, which can display a high-definition image.

Embodiment 2

In this embodiment, specific configuration examples of semiconductor devices are described with reference to FIGS. 4A to 4C and FIGS. 5A and 5B.

In FIG. 4A, a sealant 4005 is provided so as to surround a pixel portion 4002 provided over a substrate 4001, and the pixel portion 4002 is sealed with a substrate 4006. In FIG. 4A, a gate signal line driver circuit portion 4004 and a first circuit 4091 of a source signal line driver circuit portion 4003 which are each formed using a single crystal semiconductor film or a polycrystalline semiconductor film over an IC chip or a substrate separately prepared are mounted on the substrate 4001, in a region that is different from the region surrounded by the sealant 4005. A variety of signals and potentials are supplied to the source signal line driver circuit portion 4003, the gate signal line driver circuit portion 4004, and the pixel portion 4002 from flexible printed circuits (FPCs) 4018a and 4018b.

In FIGS. 4B and 4C, the sealant 4005 is provided so as to surround the pixel portion 4002 and the gate signal line driver circuit portion 4004 which are provided over the substrate 4001. The substrate 4006 is provided over the pixel portion 4002 and the gate signal line driver circuit portion 4004. Thus, the pixel portion 4002 and the gate signal line driver circuit portion 4004 are sealed together by the substrate 4001, the sealant 4005, and the substrate 4006.

In FIGS. 4B and 4C, the source signal line driver circuit portion 4003 is provided on the substrate 4001, in a region that is different from the region surrounded by the sealant 4005. In the source signal line driver circuit portion 4003, the first circuit 4091 formed using a single crystal semiconductor film or a polycrystalline semiconductor film over an IC chip or a substrate separately prepared is mounted over the substrate 4001, and a second circuit 4092 is formed on the substrate 4001.

In FIGS. 4B and 4C, a variety of signals and potentials are supplied to the source signal line driver circuit portion 4003, the gate signal line driver circuit portion 4004, and the pixel portion 4002 from an FPC 4018.

Although FIGS. 4B and 4C each illustrate an example in which the first circuit 4091 of the source signal line driver circuit portion 4003 is formed separately and mounted over the substrate 4001, one embodiment of the present invention is not limited to this structure.

Note that a connection method of a separately formed driver circuit portion is not particularly limited, and a chip on glass (COG) method, a wire bonding method, a tape automated bonding (TAB) method, or the like can be used. FIG. 4A illustrates an example in which the first circuit 4091 of the source signal line driver circuit portion 4003 and the gate signal line driver circuit portion 4004 are mounted by a COG method. FIG. 4B illustrates an example in which the first circuit 4091 of the source signal line driver circuit portion 4003 is mounted by a COG method. FIG. 4C illustrates an example in which the first circuit 4091 of the source signal line driver circuit portion 4003 is mounted by a TAB method.

Note that the semiconductor display device includes a panel in which a display element provided in a pixel is sealed, and a module in which an IC and the like including a controller are mounted on the panel.

Note that a semiconductor device in this specification means an image display device, a display device, or a light source (including a lighting device). Further, the semiconductor device includes any of the following modules in its category: a module including a connector such as an FPC, a TAB tape, or a TCP and a module including a TCP which is provided with a printed wiring board at the end thereof.

As a display element provided in the semiconductor device, a liquid crystal element (also referred to as a liquid crystal display element) or a light-emitting element (also referred to as a light-emitting display element) can be used. The light-emitting element includes an element whose luminance is controlled by current or voltage in its category, and specifically includes an inorganic electroluminescent (EL) element, an organic EL element, and the like. Furthermore, a display medium whose contrast is changed by an electric effect, such as electronic ink, can be used.

One embodiment of the semiconductor device is described with reference to FIGS. 5A and 5B. FIGS. 5A and 5B correspond to cross-sectional views along line M-N in FIG. 4A.

As illustrated in FIGS. 5A and 5B, the semiconductor devices each include a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as gate electrode layers of the transistors 4010 and 4011.

The pixel portion 4002, the gate signal line driver circuit portion 4004, and the second circuit 4092 of the source signal line driver circuit portion 4003 which are provided over the substrate 4001 include a plurality of transistors. FIGS. 5A and 5B illustrate the transistor 4010 included in the pixel portion 4002 and the transistor 4011 included in the second circuit 4092 of the source signal line driver circuit portion 4003 as an example. In FIG. 5A, an insulating film 4024 is provided over the transistors 4010 and 4011. In FIG. 5B, an insulating film 4021 is further provided over the transistor 4010.

The transistors 4011a to 4011f described in Embodiment 1 can be applied to the transistors 4010 and 4011. Described in this embodiment is an example in which a transistor having a structure similar to that of the transistor 4011a described in Embodiment 1 is used.

In this embodiment, in each of the transistors 4010 and 4011, an oxide semiconductor stacked layer is used as a channel formation region. The oxide semiconductor stacked layer has a layered structure including two or more layers. In the case of two layers, the oxide semiconductor stacked layer includes the first oxide semiconductor film including indium and a Group 13 element other than indium and the second oxide semiconductor film including indium and a Group 13 element other than indium over or below the first oxide semiconductor film. The first oxide semiconductor film has an atomic ratio where an atomic percent of indium is greater than an atomic percent of the Group 13 element other than indium and the second oxide semiconductor film has an atomic ratio where an atomic percent of indium is less than or equal to an atomic percent of the Group 13 element other than indium.

In the case where the oxide semiconductor stacked layer has a layered structure including three layers, the oxide semiconductor stacked layer includes the first oxide semiconductor film including indium and a Group 13 element other than indium, a second oxide semiconductor film including indium and a Group 13 element other than indium below the first oxide semiconductor film, and a third oxide semiconductor film including indium and a Group 13 element other than indium over the first oxide semiconductor film. The first oxide semiconductor film has the atomic ratio where the atomic percent of indium is greater than the atomic percent of the Group 13 element other than indium. The second oxide semiconductor film has the atomic ratio where the atomic percent of indium is less than or equal to the atomic percent of the Group 13 element other than indium. The third oxide semiconductor film has the atomic ratio where the atomic percent of indium is less than or equal to the atomic percent of the Group 13 element other than indium.

The transistors 4010 and 4011 can be transistors each having a field effect mobility of 20 $cm^2$/Vs or higher.

With the above described structure, semiconductor devices including the transistors 4010 and 4011 illustrated in FIGS. 5A and 5B of this embodiment each can be a high-performance and high-reliability semiconductor device, which can display a high-definition image.

As a structure of a connection portion of the semiconductor integrated circuit like the first circuit 4091 and a wiring which is electrically connected to the transistor 4011 like the second circuit 4092 provided over the substrate, the wiring over the substrate and a bump which is a conductive projection provided for an electrode in the semiconductor integrated circuit may be made in contact with each other, and the substrate and the semiconductor integrated circuit may be fixed with a resin. Alternatively, it is possible that a resin in which conductive particles are dispersed is provided between the wiring over the substrate and an electrode terminal of the semiconductor integrated circuit; and the semiconductor integrated circuit and the wiring over the substrate are connected to each other with the conductive particles and are bonded and fixed to each other with an organic resin in which conductive particles are dispersed. As the resin used for bonding, a light curable resin, a thermosetting resin, a resin which is naturally cured, or the like can be used. As a mounting method, a wire bonding method may be used.

In this embodiment, the first circuit 4091 including a transistor 4509 is electrically connected to a wiring 4520 connected to the second circuit 4092 including the transistor 4011 through an anisotropic conductive film 4540.

Further, the first circuit 4091 is electrically connected to an FPC 4518 through the anisotropic conductive film 4019, the connection terminal electrode 4015, the terminal electrode 4016, and the anisotropic conductive film 4540.

Although not shown, the first circuit 4091 can adhere to the first substrate 4001 by an adhesive layer.

The transistor 4010 included in the pixel portion 4002 is electrically connected to a display element to form a display panel. There is no particular limitation on the kind of the display element as long as display can be performed, and various kinds of display elements can be employed.

An example of a liquid crystal display device using a liquid crystal element as a display element is illustrated in FIG. 5A. In FIG. 5A, a liquid crystal element 4013 which is a display element includes the first electrode layer 4030, a second electrode layer 4031, and a liquid crystal composition 4008. An insulating film 4032 and an insulating film 4033 functioning as orientation films are provided so that the liquid crystal composition 4008 is provided therebetween. The second electrode layer 4031 is provided on the substrate 4006 side, and the first electrode layer 4030 and the second electrode layer 4031 are stacked with the liquid crystal composition 4008 provided therebetween.

A spacer 4035 is a columnar spacer obtained by selective etching of an insulating film and is provided in order to control the thickness of the liquid crystal composition 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is not used may be used for the liquid crystal composition 4008. In this case, the liquid crystal composition 4008 is in contact with the first electrode layer 4030 and the second electrode layer 4031. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor film has a possibility that the electric characteristics of the transistor may fluctuate significantly by the influence of static electricity and deviate from the designed range. Thus, it is more effective to use a liquid crystal composition exhibiting a blue phase for the liquid crystal display device including the transistor including an oxide semiconductor film.

The specific resistivity of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like.

In the transistor using an oxide semiconductor film disclosed in this specification, the current in an off state (off-state current) can be controlled to be low. Accordingly, an electric signal such as an image signal can be held for a longer period, and a writing interval can be set longer in an on state. Thus, the frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an advanced super view (ASV) mode, and the like can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example in which an organic EL element is used as a light-emitting element is described.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element is illustrated in FIG. 5B.

In the light-emitting device illustrated in FIG. 5B, a light-emitting element 4513 which is a display element is electrically connected to the transistor 4010 provided in the pixel portion 4002. A structure of the light-emitting element 4513 is not limited to the illustrated stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using either a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed.

Further, a layer containing an organic compound may be deposited by a deposition method to cover the light-emitting element 4513 so that oxygen, hydrogen, moisture, carbon dioxide, and the like do not enter the light-emitting element 4513.

In addition, in a space which is formed with the substrate 4001, the substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these materials.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

Note that flexible substrates as well as glass substrates can be used as the substrate 4001 and the substrate 4006. For example, a light-transmitting plastic substrate or the like can be used. As plastic, a polyvinyl fluoride (PVF) film, a polyester film, or an acrylic resin film can be used. In the case where a light-transmitting property is not needed, a metal substrate (metal film) of aluminum, stainless steel, or the like may be used. Alternatively, a composite material may be used. For example, a sheet with a structure in which a fiberglass-reinforced plastics (FRP) plate or an aluminum foil is sandwiched between PVF films or polyester films can also be used.

The insulating film 4024 can have a single-layer structure or a stacked-layer structure including any of oxide insulating films such as a silicon oxide film, a silicon oxynitride film, an aluminum oxide film, and an aluminum oxynitride film; and nitride insulating films such as a silicon nitride film, a silicon nitride oxide film, an aluminum nitride film, and an aluminum nitride oxide film.

Further, the insulating film 4021 functioning as a planarization insulating film can be formed using an organic material having heat resistance, such as an acrylic-, polyimide-, or benzocyclobutene-based resin, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The insulating film may be formed by stacking a plurality of insulating films formed of these materials.

There is no particular limitation on the method of forming the insulating film 4021, and the following method or tool (equipment) can be used depending on the material: a sputtering method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

Alternatively, the first electrode layer 4030 and the second electrode layer 4031 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

A conductive composition containing a conductive high molecule (also referred to as a conductive polymer) can be used for the first electrode layer 4030 and the second electrode layer 4031.

Since the transistor is easily broken owing to static electricity or the like, a protective circuit for protecting the driver circuit is preferably provided. The protection circuit is preferably formed using a nonlinear element.

As described above, a semiconductor device having a variety of functions can be provided.

The structures, methods, and the like described in this embodiment can be combined with any of the structures, methods, and the like described in the other embodiments as appropriate.

Embodiment 3

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like.

Examples of electronic appliances each including the semiconductor device described in the above embodiments are described. For example, the display device described in Embodiment 1 or Embodiment 2 can be applied to a display portion.

Figure 6A:
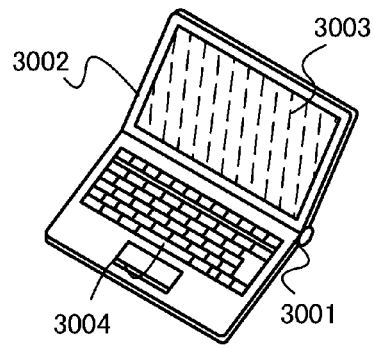
FIGS. 6A to 6F each illustrate an electronic appliance.

FIG. 6A illustrates a laptop personal computer, which includes a main body 3001, a housing 3002, a display portion 3003, a keyboard 3004, and the like. The semiconductor device described in any of Embodiments 1 to 3 is applied to the display portion 3003, whereby a high-performance and high-reliability laptop personal computer can be provided.

Figure 6B:
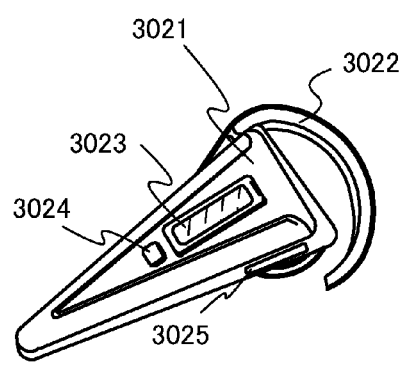

FIG. 6B illustrates a portable music player which includes, in a main body 3021, a display portion 3023, a fixing portion 3022 with which the main body is worn on the ear, a speaker, an operation button 3024, an external memory slot 3025, and the like. The semiconductor device described in Embodiment 1 or Embodiment 2 is applied to the display portion 3023, whereby a high-performance and high-reliability portable music player (PDA) can be provided.

Furthermore, when the portable music player illustrated in FIG. 6B has an antenna, a microphone function, or a wireless communication function and is used with a mobile phone, a user can talk on the phone wirelessly in a hands-free way while driving a car or the like.

Figure 6C:
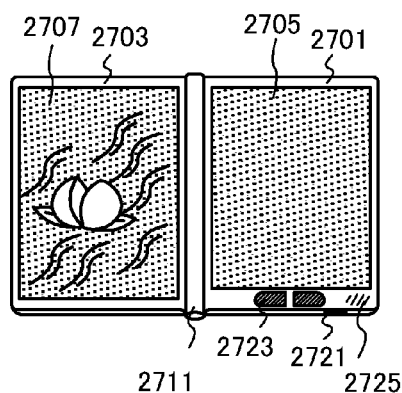

FIG. 6C illustrates an example of an e-book reader. For example, an e-book reader includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 6C) can display text and a display portion on the left (the display portion 2707 in FIG. 6C) can display graphics. The semiconductor device described in Embodiment 1 or Embodiment 2 is applied to the display portion 2705 and the display portion 2707, whereby a high-performance and high-reliability e-book reader can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 6C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an electronic book server.

Figure 6D:
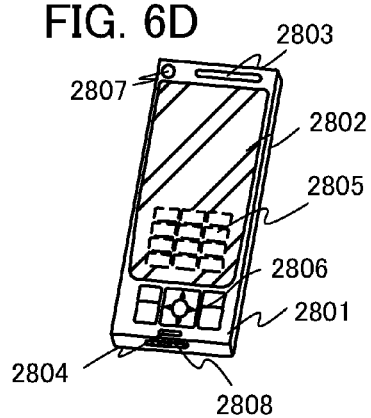

FIG. 6D illustrates a mobile phone. The housing 2801 is provided with a display panel 2802, a speaker 2803, a microphone 2804, a pointing device 2806, a camera lens 2807, an external connection terminal 2808, and the like. Further, an antenna is incorporated in the housing 2801. The semiconductor device described in Embodiment 1 or Embodiment 2 is applied to the display panel 2802, whereby a high-performance and high-reliability mobile phone can be provided.

The display panel 2802 is provided with a touch panel. A plurality of operation keys 2805 which is displayed as images is illustrated by dashed lines in FIG. 6D. Note that a mobile phone illustrated in FIG. 6D may be provided with a solar cell and the mobile phone may include a booster circuit for increasing a voltage output from the solar cell to a voltage needed for each circuit.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone, recording, playback, and the like without being limited to verbal communication.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 6E:
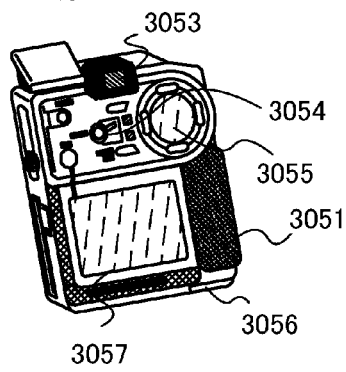

FIG. 6E illustrates a digital video camera which includes a main body 3051, a display portion A 3057, an eyepiece 3053, an operation switch 3054, a display portion B 3055, a battery 3056, and the like. The semiconductor device described in Embodiment 1 or Embodiment 2 is applied to the display portion A 3057 and the display portion B 3055, whereby a high-performance and high-reliability digital video camera can be provided.

Figure 6F:
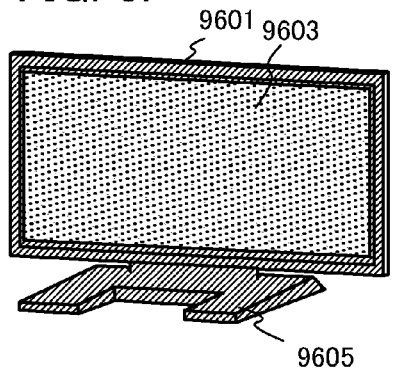

FIG. 6F illustrates an example of a television set. In the television set, a display portion 9603 is incorporated in a housing 9601. The display portion 9603 can display images. Here, the housing 9601 is supported by a stand 9605. The semiconductor device described in Embodiment 1 or Embodiment 2 is applied to the display portion 9603, whereby a high-performance and high-reliability television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

This application is based on Japanese Patent Application serial no. 2012-124045 filed with Japan Patent Office on May 31, 2012, the entire contents of which are hereby incorporated by reference.

What is claimed is:
1. A semiconductor device comprising:
a first transistor (4011_1 in 4092_1), a second transistor (4011_1 in 4092_2), a third transistor (4011_1 in 4092_3), a fourth transistor (4011_2 in 4092_1), a fifth transistor (4011_2 in 4092_2) and a sixth transistor (4011_2 in 4092_3); and
a first wiring (5604_1), a second wiring (5604_2), a third wiring (5605_1), a fourth wiring (5605_2), a fifth wiring (5605_3), a sixth wiring (S1) and a seventh wiring (S2),
wherein the first wiring is electrically connected to one of a source and a drain of the first transistor, one of a source and a drain of the second transistor, and one of a source and a drain of the third transistor,
wherein the second wiring is electrically connected to one of a source and a drain of the fourth transistor, one of a source and a drain of the fifth transistor, and one of a source and a drain of the sixth transistor,
wherein the third wiring is electrically connected to a gate of the first transistor and a gate of the fourth transistor,
wherein the fourth wiring is electrically connected to a gate of the second transistor and a gate of the fifth transistor,
wherein the fifth wiring is electrically connected to a gate of the third transistor and a gate of the sixth transistor,
wherein the sixth wiring is electrically connected to the other of the source and the drain of the first transistor,
wherein the seventh wiring is electrically connected to the other of the source and the drain of the fourth transistor,
wherein each of the first transistor, the second transistor, the third transistor, the fourth transistor, the fifth transistor and the sixth transistor comprises an oxide semiconductor layer,
wherein a first video signal is supplied to the first wiring,
wherein a second video signal is supplied to the second wiring,
wherein the oxide semiconductor layer comprises a first oxide semiconductor film and a second oxide semiconductor film which are stacked with each other,
wherein the first oxide semiconductor film comprises indium and a Group 13 element other than the indium and has a composition where an atomic percent of the indium is greater than an atomic percent of the Group 13 element other than the indium, and
wherein the second oxide semiconductor film comprises indium and a Group 13 element other than the indium and has a composition where an atomic percent of the indium is less than or equal to an atomic percent of the Group 13 element other than the indium.

2. The semiconductor device according to claim 1, wherein the first oxide semiconductor film has a composition where the atomic percent of the indium is greater than twice of the atomic percent of the Group 13 element other than the indium.

3. The semiconductor device according to claim 2, wherein the Group 13 element other than the indium is gallium.

4. The semiconductor device according to claim 1, wherein the first oxide semiconductor film comprises zinc and has a composition where an atomic ratio of indium, gallium, and zinc is substantially 3:1:2.

5. The semiconductor device according to claim 1, wherein the second oxide semiconductor film comprises zinc and has a composition where an atomic ratio of indium, gallium, and zinc is substantially 1:1:1.

6. The semiconductor device according to claim 1, wherein at least one of the first transistor, the second transistor, the third transistor, the fourth transistor, the fifth transistor and the sixth transistor comprises silicon and nitrogen as a gate insulating film.

7. The semiconductor device according to claim 1, wherein the first oxide semiconductor film or the second oxide semiconductor film comprises a c-axis aligned crystalline oxide semiconductor.

8. The semiconductor device according to claim 1, wherein the first oxide semiconductor film or the second oxide semiconductor film comprises an amorphous oxide semiconductor.

9. The semiconductor device according to claim 1,
wherein the oxide semiconductor layer further comprises a third oxide semiconductor film,
wherein the first oxide semiconductor film is interposed between the second oxide semiconductor film and the third oxide semiconductor film, and
wherein the third oxide semiconductor film comprises indium and a Group 13 element other than the indium and has a composition where an atomic percent of the indium is less than or equal to an atomic percent of the Group 13 element other than the indium.

10. The semiconductor device according to claim 9, wherein the third oxide semiconductor film comprises a c-axis aligned crystalline oxide semiconductor.

11. The semiconductor device according to claim 9, wherein the third oxide semiconductor film comprises an amorphous oxide semiconductor.

12. The semiconductor device according to claim 9,
wherein the Group 13 element other than the indium is gallium, and
wherein the first oxide semiconductor film comprises zinc and has a composition where an atomic ratio of indium, gallium, and zinc is substantially 3:1:2.

13. The semiconductor device according to claim 9,
wherein the Group 13 element other than the indium is gallium, and
wherein the second oxide semiconductor film comprises zinc and has a composition where an atomic ratio of indium, gallium, and zinc is substantially 1:3:2.

14. The semiconductor device according to claim 9,
wherein the Group 13 element other than the indium is gallium, and
wherein the third oxide semiconductor film comprises zinc and has a composition where an atomic ratio of indium, gallium, and zinc is substantially 1:1:1.

* * * * *

UNITED STATES PATENT AND TRADEMARK OFFICE
CERTIFICATE OF CORRECTION

PATENT NO. : 9,224,758 B2
APPLICATION NO. : 14/334079
DATED : December 29, 2015
INVENTOR(S) : Shunpei Yamazaki et al.

It is certified that error appears in the above-identified patent and that said Letters Patent is hereby corrected as shown below:

IN THE SPECIFICATION

At column 5, line 63, "4011_a." should be --4011a.--;

At column 7, line 60, "4011_b" should be --4011b--;

At column 8, line 4, "4011_b," should be --4011b,--;

At column 11, line 10, "$(a-A)^2 + (b-B)^2 + (c-C)^2 \geq r2$," should be --$(a-A)^2 + (b-B)^2 + (c-C)^2 \leq r^2$,--;

At column 14, line 67, "Formula (I)." should be --Formula (1).--;

IN THE CLAIMS

In claim 3, column 31, line 4, "claim 2," should be --claim 1,--.

Signed and Sealed this
Twenty-eighth Day of June, 2016

Michelle K. Lee
*Director of the United States Patent and Trademark Office*